(12) United States Patent
Huang et al.

(10) Patent No.: US 7,643,563 B2
(45) Date of Patent: Jan. 5, 2010

(54) TRANSMISSION LINE DRIVER

(75) Inventors: Chin-Wen Huang, Kao-Hsiung Hsien (TW); Chen-Chih Huang, Hsin-Chu Hsien (TW); Ming-Yuh Yeh, Taipei (TW)

(73) Assignee: Realtek Semiconductor Corp., Hsinchu (TW)

( * ) Notice: Subject to any disclaimer, the term of this patent is extended or adjusted under 35 U.S.C. 154(b) by 654 days.

(21) Appl. No.: 10/908,636

(22) Filed: May 20, 2005

(65) Prior Publication Data

US 2005/0195904 A1    Sep. 8, 2005

Related U.S. Application Data

(63) Continuation-in-part of application No. 10/909,811, filed on Aug. 2, 2004.

(30) Foreign Application Priority Data

Aug. 4, 2003  (TW) .............................. 92121312 A
Apr. 28, 2004 (TW) .............................. 93111917 A
May 21, 2004 (TW) .............................. 93114580 A

(51) Int. Cl.
*B60K 41/12* (2006.01)

(52) U.S. Cl. ...................................... 375/257; 375/258
(58) Field of Classification Search ................ 375/219, 375/220, 257, 258; 455/402; 327/108
See application file for complete search history.

(56) References Cited

U.S. PATENT DOCUMENTS 5,420,499 A * 5/1995 DeShazo .................... 323/315
5,721,594 A    2/1998 Gurley et al.
6,665,347 B2  12/2003 van Bavel et al.

OTHER PUBLICATIONS

Chinese language office action dated Dec. 26, 2008.

* cited by examiner

*Primary Examiner*—David C Payne
*Assistant Examiner*—Leon Flores
(74) *Attorney, Agent, or Firm*—Thomas, Kayden, Horstemeyer & Risley

(57) ABSTRACT

A transmission line driver for generating an output signal to drive a transmission line is disclosed. The transmission line driver includes a voltage driver and a current driver. The voltage driver generates a voltage signal to drive the transmission line. The current driver generates a current signal to drive the transmission line. The amplitude of the output signal is determined according to the voltage signal and/or the current signal.

21 Claims, 6 Drawing Sheets

TRANSMISSION LINE DRIVER

CROSS REFERENCE TO RELATED APPLICATIONS

This application is a continuation-in-part and claims the benefit of U.S. application Ser. No. 10/909,811, which was filed on Aug. 2, 2004 and is included herein by reference. U.S. application Ser. No. 10/909,811 in turn claims the benefits of Taiwan applications Serial No. 92121312, filed Aug. 4, 2003 and Taiwan application Serial No. 93111917, filed Apr. 28, 2004, the subject matter of which also being incorporated herein by reference.

BACKGROUND OF INVENTION

1. Field of the Invention

The present invention relates to transmission lines, and more particularly, to a transmission line driver for driving a transmission line.

2. Description of the Prior Art

With the advances in modern technology, human beings rely more and more on computer networks. Since many network applications (such as online multimedia applications) have strict bandwidth requirements, the bandwidth of some network devices has been upgraded from 10/100 Mbs to 1000 Mbs.

Under different transmission rates, a network device drives a transmission line by generating signals with different swing amplitudes. Generally speaking, under a low transmission rate (for example, 10 Mbs), signals with large swing amplitude should be used, hence a conventional network device will use a current mode to drive the transmission line. Under a high transmission rate (for example, 100/1000 Mbs), however, signals with low swing amplitude would be enough, and at this time a conventional network device will use a voltage mode to drive the transmission line.

FIG. 1 shows a schematic diagram of a conventional driver 100. The driver 100 shown in FIG. 1 drives a transmission line (represented by its equivalent impedance $R_L$) through a transformer 50. Under a 10 Mbs transmission rate, the driver 100 operates under the current mode and a current driver 110 of the driver 100 generates current signals TXIP and TXIN to drive the transmission line. Under a 100/1000 Mbs transmission rate, the driver 100 operates under the voltage mode and a voltage driver 130 of the driver 100 generates voltage signals TXVP and TXVN to drive the transmission line. In the conventional driver 100 shown in FIG. 1, the current mode and the voltage mode operate in a mutually exclusive manner. Further more, the current driver 110 and the voltage driver 130 operate independent of each other.

SUMMARY OF INVENTION

It is therefore an objective of the present invention to provide a transmission line driver comprising a transconductance circuit for driving a transmission line more effectively.

According to an embodiment of the present invention, a transmission line driver is disclosed for generating an output signal to drive a transmission line. The transmission line driver includes: a voltage driver utilized to receive an input signal, and generate a voltage signal according to the input signal to drive the transmission line; and a current driver utilized to receive an input signal, and generate a current signal according to the input signal to drive the transmission line; wherein only the voltage driver is used under a first mode of the transmission line driver, and both the voltage driver and the current driver are used under a second mode of the transmission line driver.

According to another embodiment of the present invention, a method is disclosed for generating an output signal to drive a transmission line at a first data rate or at a second data rate, the method comprising: determining data rate of the transmission line is the first data rate or the second data rate; generating a first voltage signal to drive the transmission line when the data rate is the first data rate; and generating a second voltage signal to drive the transmission line, and generating a current signal to drive the transmission line when the data rate is the second rate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
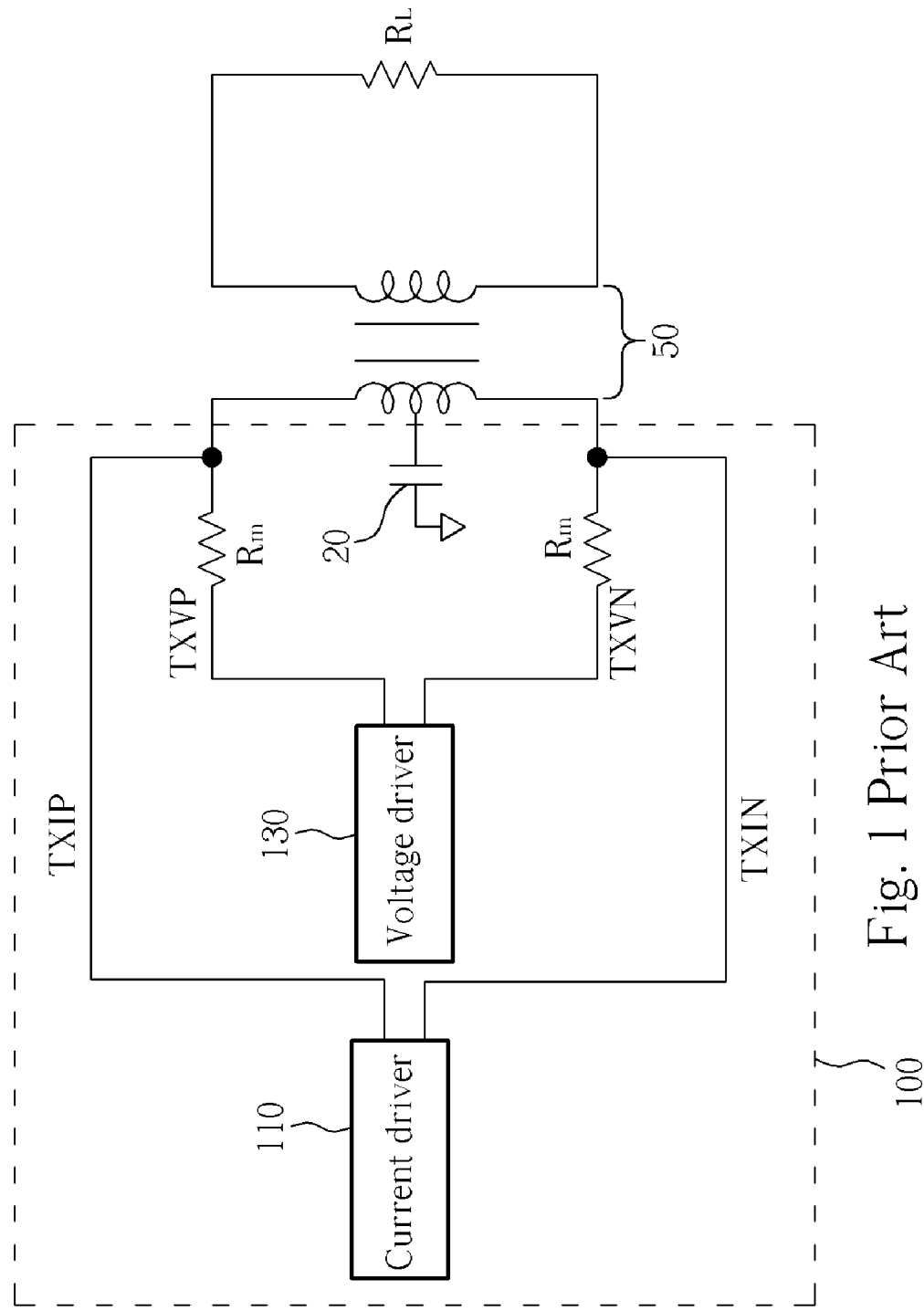
FIG. 1 shows a schematic diagram of a conventional transmission line driver.
Figure 2:
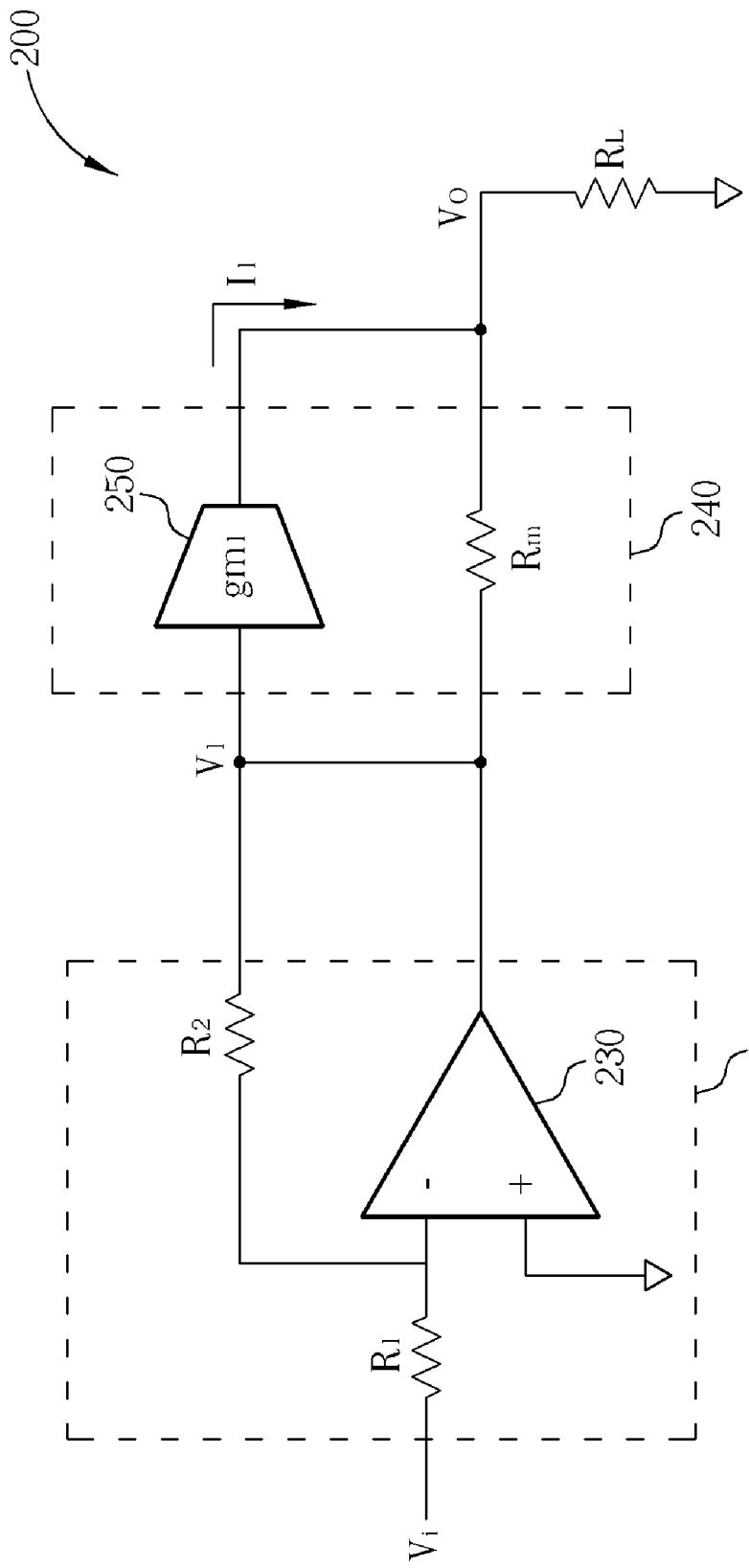
FIG. 2 shows a schematic diagram of a transmission line driver according to the present invention.

FIG. 2 shows a schematic diagram of a transmission line driver 200 according to a first embodiment of the present invention. The transmission line driver 200 generates an output signal $V_o$ according to an input signal $V_i$ to drive a transmission line (represented by its equivalent impedance $R_L$). Under a higher transmission rate (such a 100/1000 Mbs rate), the output signal $V_o$ has a smaller amplitude; under a lower transmission rate (such a 10 Mbs rate), the output signal $V_o$ has a larger amplitude.

In this embodiment, the transmission line driver 200 contains a voltage driver 220 and a drive circuit 240. The voltage driver 220 receives the input signal $V_i$ and amplifies the input signal $V_i$ to generate a first voltage signal $V_1$. The voltage driver 220 includes a first impedance $R_1$, an operational amplifier 230, and a second impedance $R_2$, these elements are connected as shown in FIG. 2.

The drive circuit 240 is coupled to the voltage driver 220 and the transmission line and also drives the transmission line. The drive circuit 240 includes a current driver 250 and a matched impedance $R_m$. Since under a higher transmission rate (such a 100/1000 Mbs rate) the signals on the transmission line do not require a large amplitude, the transmission line driver 200 could use only the voltage driver 220 to drive the transmission line and disable the operation of the current driver 250. Under a lower transmission rate (such a 10 Mbs rate), however, the signals on the transmission line require a large amplitude and the transmission line driver 200 should use both the voltage driver 220 and the current driver 250 to drive the transmission line simultaneously.

In an embodiment, the current driver 250 is a transconductance circuit. The transconductance circuit 250 shown in FIG.

2 is coupled to the voltage driver 220 and the transmission line. When the transconductance circuit 250 is under operation, it converts the first voltage signal $V_1$ into a current signal $I_1$. Under this situation, the drive circuit 240 generates the output signal $V_o$ according to the received first voltage signal $V_1$ and the current signal $I_1$ generated by the transconductance circuit 250 to drive the transmission line.

As mentioned before, the transconductance circuit 250 is capable of converting a voltage signal into a current signal. In this embodiment, the current signal $I_1$ generated by the transconductance circuit 250 is equal to $V_1 \times gm_1$, where $gm_1$ is a transconductance value of the transconductance circuit 250. If $R_m$ is substantially equal to $R_L$ (for example, $R_m = R_L = R = 100\Omega$), then the output signal $V_o$ generated by the drive circuit 240 will be as follows.

$$V_O = \frac{1 + gm_1 \times R}{2} \times V_1$$

Assuming that $gm_1$ is equal to $1/R$, the output signal $V_o$ will approximate the first voltage signal $V_1$. Under a 10 Mbs transmission rate, the amplitude of the current signal $I_1$ is roughly 25 mA. However, if the conventional transmission line driver 100 is used, the current driver 110 should generate current signals with 50 mA amplitude. Apparently, with the circuit structure provided by the present invention, a great amount of current could be saved.

Figure 3:
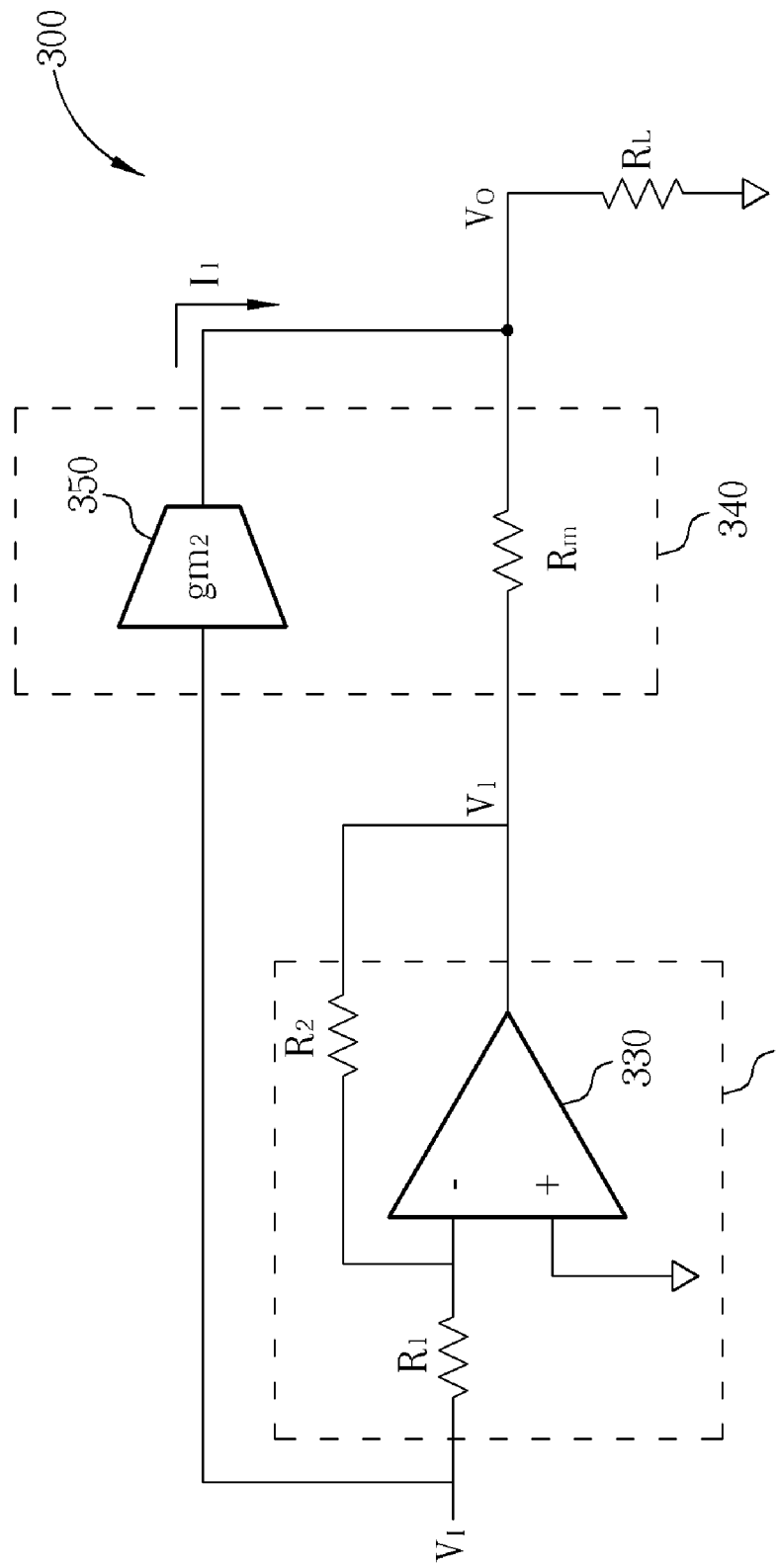
FIG. 3 shows a schematic diagram of another transmission line driver according to the present invention.

FIG. 3 shows a schematic diagram of another transmission line driver 300 according to the present invention. Similar to the transmission line driver 200 of FIG. 2, the transmission line driver 300 is for generating an output signal $V_o$ according to an input signal $V_i$ to drive the a transmission line (represented by its equivalent impedance $R_L$). A different point is that in FIG. 2 the first voltage signal $V_1$ generated by the voltage driver 220 is used as the input signal of the current driver 250, and the transconductance circuit 250 generates the current signal $I_1$ according to the first voltage signal $V_1$ (under this structure the input end of the transconductance circuit 250 should have a larger swing range). As for the transmission line driver 300 of FIG. 3, the input signal $V_i$ is inputted to the current driver 350 directly, and the current driver 350 generates the current signal $I_1$ according to the input signal $V_i$. In this embodiment, the current driver 350 is a transconductance circuit. As long as the transconductance value $gm_2$ of the transconductance circuit 350 is equal to $(-R_2/R_1)$ times the transconductance value $gm_1$ of the transconductance circuit 250, the transmission line driver 300 of FIG. 3 and the transmission line driver 200 of FIG. 2 will function similarly.

Please note that any kind of circuit that converts a voltage signal into a current signal could be used as the transconductance circuit 250 or 350. For example, the transconductance circuit 250 or 350 could have a single-ended structure, differential structure, open loop structure, or close loop structure.

Figure 4:
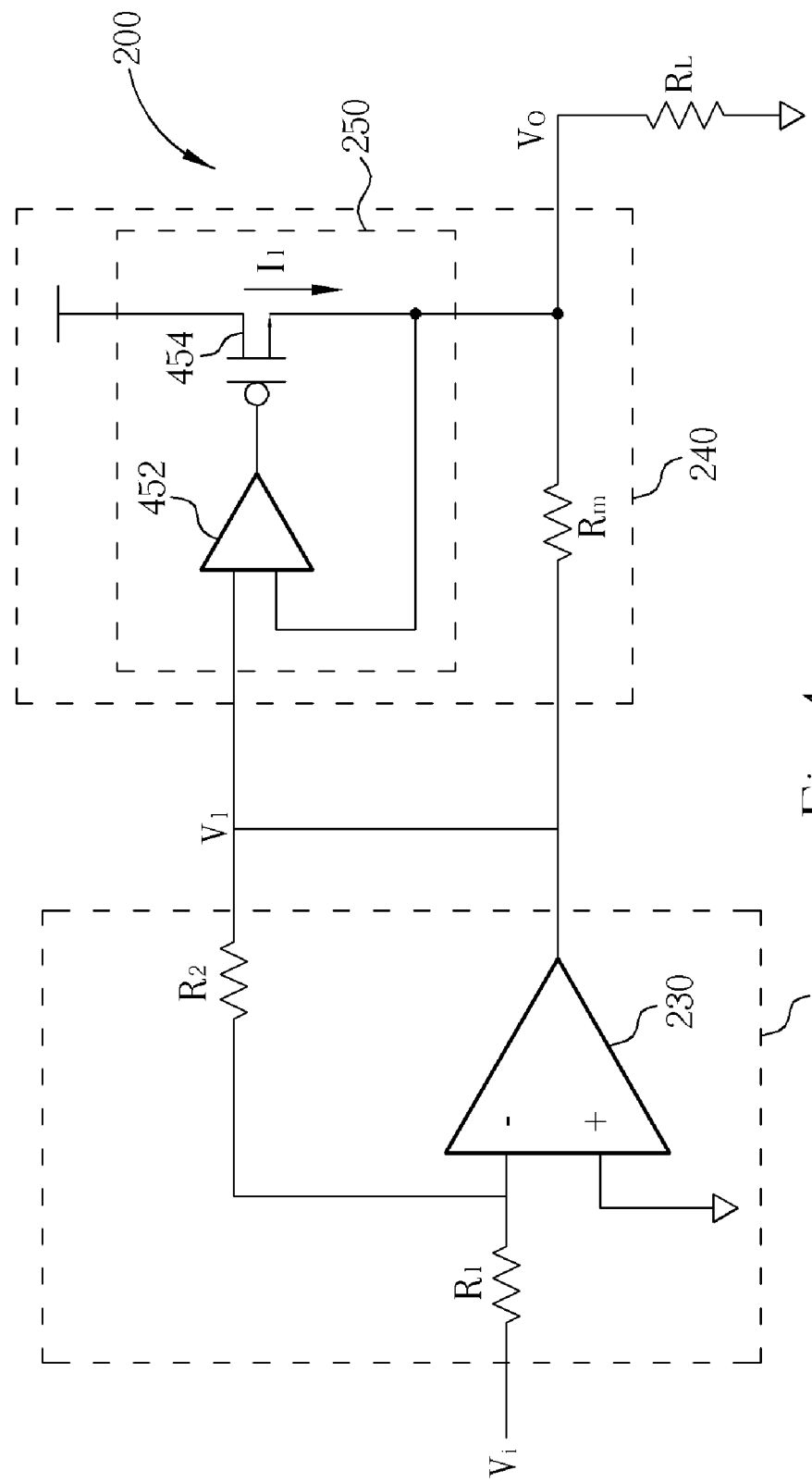
FIG. 4 shows a schematic diagram of a first embodiment of the transmission line driver of FIG. 2.

FIG. 4 shows a schematic diagram of the transmission line driver of FIG. 2 with the transconductance circuit having a single-ended close-loop structure. The output signal $V_o$ is fed back to an input end of an operational amplifier 452 and a transistor 454 generates the current signal $I_1$ according to the signal outputted by the operational amplifier 452. Since the operation principle is not complicated, further explanation will be omitted.

Figure 5:
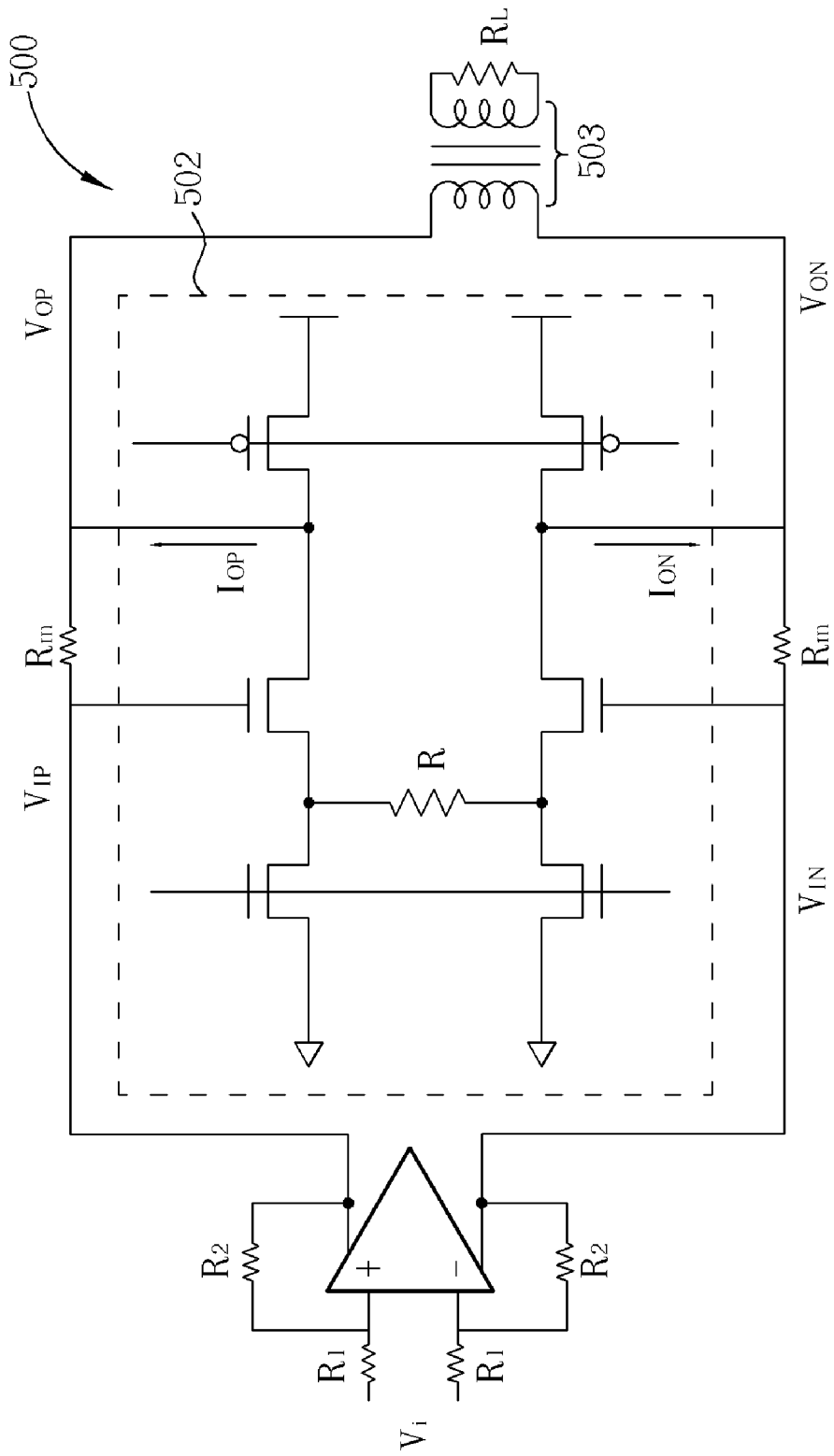
FIG. 5 shows a schematic diagram of a second embodiment of the transmission line driver of FIG. 2.

FIG. 5 shows a schematic diagram of the transmission line driver of FIG. 2 with the transconductance circuit having a differential open-loop structure. Two voltage signals $V_{IP}$ and $V_{IN}$ are used as the differential input signals of the current driver 502, and the current driver 502 outputs two current signals $I_{ON}$ and $I_{OP}$ as the differential output signals. In this embodiment the transconductance value of the current driver 502 is roughly equal to 1/R. In another embodiment, the resistor R could be omitted. Since the basic idea is still the same as the circuit shown in FIG. 2, further explanation will also be omitted here.

Figure 6:
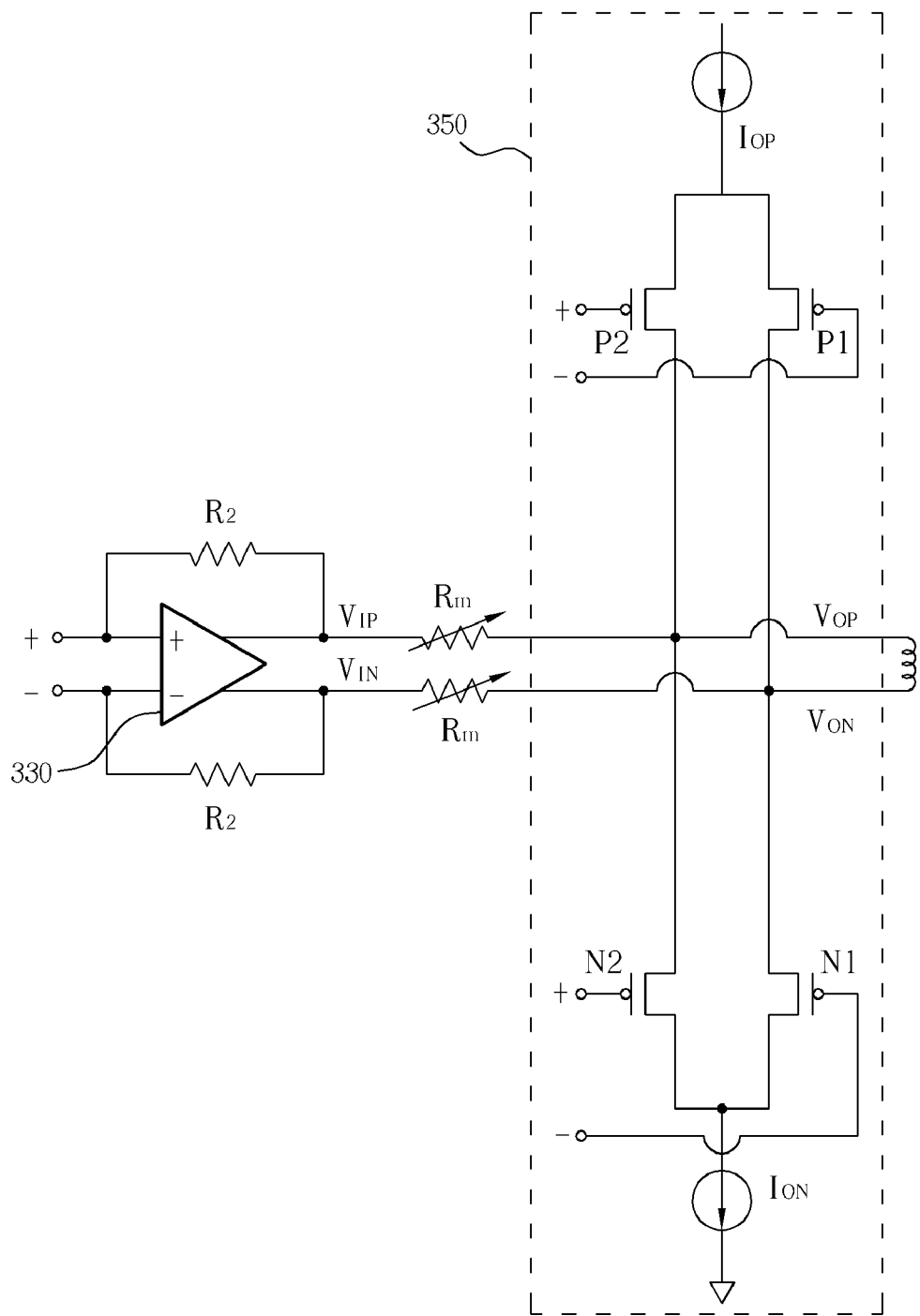
FIG. 6 shows a differential structure of a first embodiment of the transmission line driver of FIG. 3 with a DAC.

FIG. 6 shows a differential structure of a first embodiment of the transmission line driver of FIG. 3 with a DAC. As the transmission line driver 300 of FIG. 6, in this embodiment, the current driver 350 is a digital-to-analog converter (DAC).

In addition, in the embodiments mentioned before, a control logic could also be included to determine and control the transmission line driver to operate under a higher transmission rate or a lower transmission rate, the amplitude of the output signal $V_o$ would be determined according to the voltage driver and/or the current driver.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transmission line driver for generating an output signal to drive a transmission line, the transmission line driver comprising:

a voltage driver utilized to generate a first voltage signal according to an input signal and drive the transmission line; and a drive circuit coupled between a node of the voltage driver and the transmission line, such that the drive circuit receives a second voltage signal from the node of the voltage driver, wherein the drive circuit is configured to generate the output signal according to the second voltage signal using a transconductance circuit and a matched impedance connected in parallel with the transconductance circuit and drive the transmission line with the output signal, wherein the second voltage signal corresponds to the input signal;

wherein the transconductance circuit is disabled when operating at a first transmission rate and the transconductance circuit provides a current signal when operating at a second transmission rate.

2. The transmission line driver of claim 1, wherein the voltage driver comprises:

an operational amplifier having an input for receiving the input signal, and an output coupled to the drive circuit for outputting the first voltage signal; and a second impedance coupled between the output and the input.

3. The transmission line driver of claim 1, wherein the transconductance circuit comprises:

a transistor coupled to the transmission line, for generating the output signal according to the second voltage signal.

4. The transmission line driver of claim 3, wherein the transconductance circuit further comprises:

an operational amplifier having an input for receiving the second voltage signal, and an output coupled to the transistor.

5. The transmission line driver of claim 1, wherein the second voltage signal is the first voltage signal or the input signal.

6. The transmission line driver of claim 1, wherein under the first transmission rate, the drive circuit generates the output signal having a voltage magnitude that is proportional to a magnitude of the first voltage signal, and under the second transmission rate, the drive circuit generates the output signal having a current magnitude that is proportional to the magnitude of the second voltage signal.

7. The transmission line driver of claim 6, wherein the first transmission rate comprises transmission rate of 100 Mbs or a transmission rate of 1000 Mbs or both, and the second transmission rate comprises a transmission rate of 10 Mbs.

8. The transmission line driver of claim 1, wherein the transconductance circuit has a transconductance value which corresponds to an impedance of the transmission line.

9. The transmission line driver of claim 1, wherein the transconductance circuit comprises first and second current sources and a switch.

10. The transmission line driver of claim 1, wherein the first voltage signal is substantially equal to the second voltage signal.

11. The transmission line driver of claim 1, wherein the transconductance circuit comprises first and second current sources and a transistor pair.

12. The transmission line driver of claim 1, wherein the transconductance circuit is disabled under the first transmission rate and the transconductance circuit provides a current signal under the second transmission rate, wherein the amplitude of the current signal is roughly 25 mA.

13. A transmission line driver for driving a transmission line, comprising: a voltage driver utilized to receive a first input signal, and generate a voltage signal according to the first input signal to drive the transmission line; and a drive circuit, coupled between a node of the voltage driver and the transmission line, configured to generate an output signal according to the voltage signal to drive the transmission line; wherein the drive circuit generates the output signal having a voltage magnitude that is proportional to the voltage signal when operating in a first rate, and the drive circuit generates the output signal having a current magnitude that is proportional to the first input signal, the drive circuit comprising a transconductance circuit and a matched impedance connected in parallel with the transconductance circuit, when operating in a second rate, wherein the transconductance circuit is disabled when operating at a first transmission rate and the transconductance circuit provides a current signal when operating at a second transmission rate.

14. The transmission line driver of claim 13, wherein the first mode comprises a transmission rate of 100 Mbs or a transmission rate of 1000 Mbs or both, and the second mode comprises a transmission rate of 10 Mbs.

15. The transmission line driver of claim 13, wherein the transconductance circuit comprises: a transistor coupled to the transmission line, for generating the output signal according to the first input signal.

16. The transmission line driver of claim 15, wherein the transconductance circuit further comprises:
an operational amplifier having an input coupled to the node of the voltage driver, and an output coupled to the transistor.

17. A method for generating an output signal to drive a transmission line at a first data rate or at a second data rate, comprising: determining whether a transmission rate of the transmission line is the first data rate or the second data rate; generating by a drive circuit an output signal to drive the transmission line, wherein the output signal has a voltage magnitude that is controlled in accordance with an input voltage when the data rate is the first data rate; and generating by the drive circuit, using a transconductance circuit and a matching impedance coupled in parallel, the output signal to drive the transmission line, wherein the output signal has a current magnitude that is controlled in accordance with the input voltage when the data rate is the second data rate, wherein the transconductance circuit is disabled when operating at a first transmission rate and the transconductance circuit provides a current signal when operating at a second transmission rate.

18. A transmission line driver for generating an output signal to drive a transmission line, the transmission line driver comprising: a voltage driver configured to receive a first input signal, and generate a voltage signal according to the first input signal; and a drive circuit configured to receive the voltage signal and generate the output signal, using a transconductance circuit and a parallel-connected matching impedance, according to the voltage signal to drive the transmission line wherein the transconductance circuit is disabled when operating at a first transmission rate and the transconductance circuit provides a current signal when operating at a second transmission rate; wherein a voltage amplitude of the output signal is determined according to the voltage signal and a current magnitude of the output signal is determined according to the first input signal.

19. The transmission line driver of claim 18, wherein the amplitude of the output signal is determined by the voltage signal during a first mode of the transmission line driver; the current magnitude of the output signal is determined by the voltage signal during a second mode of the transmission line driver.

20. The transmission line driver of claim 19, wherein the first mode comprises a 100 Mbs mode or a 1000 Mbs mode or both, and the second mode comprises a 10 Mbs mode.

21. A transmission line driver for generating an output signal to drive a transmission line, the transmission line driver comprising:
a voltage driver, coupled to the transmission line, utilized to generate a first voltage signal according to an input signal and drive the transmission line; and
a current driver, coupled between a node of the voltage driver and the transmission line, comprising a transconductance circuit utilized to generate a current signal according to a voltage of the node of the voltage driver;
wherein, in a first transmission rate, the voltage driver outputs the first voltage signal and the transconductance circuit is disabled such that an amplitude of the output signal is approximately half of an amplitude of the first voltage signal;
wherein, in a second transmission rate, the voltage driver outputs the first voltage signal and the transconductance circuit is enabled such that the amplitude of the output signal is increased to approximately reach the amplitude of the first voltage signal.

* * * * *